US011357139B2

(12) United States Patent
Lee et al.

(10) Patent No.: US 11,357,139 B2
(45) Date of Patent: Jun. 7, 2022

(54) COOLING SYSTEM FOR POWER CONVERSION DEVICE

(71) Applicants: Hyundai Motor Company, Seoul (KR); Kia Motors Corporation, Seoul (KR)

(72) Inventors: Sang Hun Lee, Taebaek-si (KR); Jae Hoon Yoon, Seoul (KR)

(73) Assignees: Hyundai Motor Corporation, Seoul (KR); Kia Motors Corporation, Seoul (KR)

( * ) Notice: Subject to any disclaimer, the term of this patent is extended or adjusted under 35 U.S.C. 154(b) by 278 days.

(21) Appl. No.: 16/661,902

(22) Filed: Oct. 23, 2019

(65) Prior Publication Data

US 2020/0344920 A1    Oct. 29, 2020

(30) Foreign Application Priority Data

Apr. 24, 2019 (KR) .................... 10-2019-0048091

(51) Int. Cl.
*F28D 1/02* (2006.01)
*H05K 7/20* (2006.01)
*H01L 23/473* (2006.01)

(52) U.S. Cl.
CPC ....... *H05K 7/20927* (2013.01); *H01L 23/473* (2013.01)

(58) Field of Classification Search
CPC .......................... H05K 7/20927; H01L 23/473
USPC .......................................................... 165/153
See application file for complete search history.

(56) References Cited

U.S. PATENT DOCUMENTS

| 5,036,911 | A | * | 8/1991 | So | F28F 3/044 |
| | | | | | 165/DIG. 465 |
| 5,538,077 | A | * | 7/1996 | So | F28F 3/04 |
| | | | | | 165/170 |
| 5,800,673 | A | * | 9/1998 | Okuda | F28F 17/005 |
| | | | | | 165/913 |
| 5,964,282 | A | * | 10/1999 | Seiler | F28F 9/001 |
| | | | | | 165/170 |
| 6,032,728 | A | * | 3/2000 | Ross | F28F 9/0221 |
| | | | | | 165/173 |
| 6,216,773 | B1 | * | 4/2001 | Falta | F28D 1/0333 |
| | | | | | 165/176 |

(Continued)

FOREIGN PATENT DOCUMENTS

| KR | 10-2013-0065390 A | 6/2013 | | |
| KR | 20130065390 A | * | 6/2013 | ........... H01L 23/473 |

*Primary Examiner* — Claire E Rojohn, III
(74) *Attorney, Agent, or Firm* — Morgan, Lewis & Bockius LLP (57) ABSTRACT

A cooling system for a power conversion device may include a cooler upper-part having a plurality of cooling tubes through which cooling water flows and a connecting portion connecting the cooling tubes; one or more power conversion modules mounted between the cooling tubes; a cooling fin plate formed in a plate shape with cooling fins on a side and mounted on a side of the power conversion module such that the cooling fins are mounted in the opposite directions with respect to the power conversion module; and a cooler lower-part mounted between the cooling fin plate and the cooler upper-part, having one or more open holes formed at a portion, and combined with the cooling fin plate by inserting the cooling fins of the cooling fin plate in the open holes.

10 Claims, 8 Drawing Sheets

(56) References Cited

U.S. PATENT DOCUMENTS

| | | | | |
|---|---|---|---|---|
| 6,220,340 | B1* | 4/2001 | Cheong | F28D 1/0333 165/103 |
| 6,341,649 | B1* | 1/2002 | Joshi | F28D 1/0333 165/167 |
| 6,435,268 | B1* | 8/2002 | Bhatti | F28F 17/005 165/111 |
| 6,742,572 | B2 | 6/2004 | Muhammad | B23P 15/26 165/166 |
| 8,596,339 | B2* | 12/2013 | Palanchon | F28D 9/0031 165/174 |
| 8,678,077 | B2* | 3/2014 | Shore | F28D 1/0325 165/153 |
| 8,985,198 | B2* | 3/2015 | Braun | F28D 9/0056 165/149 |
| 9,631,876 | B2* | 4/2017 | Zima | F28D 9/0043 |
| 10,662,833 | B2* | 5/2020 | Ooi | F28D 9/0043 |
| 2003/0116302 | A1* | 6/2003 | Sauciuc | F28F 3/025 165/902 |
| 2005/0088639 | A1* | 4/2005 | Lee | G03F 7/707 355/75 |
| 2005/0141195 | A1* | 6/2005 | Pokharna | F28F 3/025 361/699 |
| 2006/0243422 | A1* | 11/2006 | Sakai | H01L 23/473 257/E23.098 |
| 2006/0249281 | A1* | 11/2006 | Park | F28F 3/044 165/176 |
| 2006/0278382 | A1* | 12/2006 | Bhatti | F28D 1/0333 165/152 |
| 2007/0023172 | A1* | 2/2007 | Obrist | F28D 1/05391 165/174 |
| 2007/0034362 | A1* | 2/2007 | Kern | F28D 1/0333 165/153 |
| 2007/0044946 | A1* | 3/2007 | Mehendale | F28F 3/046 165/153 |
| 2007/0056719 | A1* | 3/2007 | Katoh | F28F 17/005 165/146 |
| 2011/0122357 | A1* | 5/2011 | Chang | G02F 1/133512 445/24 |
| 2011/0181105 | A1* | 7/2011 | Michinaka | H01L 25/162 307/9.1 |
| 2013/0270418 | A1* | 10/2013 | Cho | G01C 3/08 250/206.1 |
| 2014/0158324 | A1* | 6/2014 | Toch | H01L 23/473 165/67 |
| 2015/0008295 | A1* | 1/2015 | Bae | H02G 3/0608 248/68.1 |
| 2017/0297020 | A1* | 10/2017 | Lee | B01L 7/52 |
| 2017/0311480 | A1* | 10/2017 | Suzuki | H01L 23/473 |
| 2017/0363375 | A1* | 12/2017 | Mayor | F28F 13/08 |
| 2018/0041107 | A1* | 2/2018 | Yamahira | H05K 7/209 |
| 2018/0063989 | A1* | 3/2018 | Lei | H01L 23/473 |
| 2018/0077818 | A1* | 3/2018 | Harkins | H05K 7/209 |
| 2018/0083548 | A1* | 3/2018 | Hagimoto | H05K 7/20927 |
| 2018/0145605 | A1* | 5/2018 | Park | B60L 3/003 |
| 2018/0332739 | A1* | 11/2018 | Takeuchi | H05K 7/20927 |
| 2018/0352686 | A1* | 12/2018 | Song | H05K 7/20927 |
| 2019/0090388 | A1* | 3/2019 | Jeong | F28D 1/0325 |
| 2019/0320549 | A1* | 10/2019 | Song | H02M 7/003 |
| 2019/0335607 | A1* | 10/2019 | Song | H05K 7/209 |
| 2019/0343020 | A1* | 11/2019 | Todorovic | H05K 9/0022 |
| 2019/0360766 | A1* | 11/2019 | Kenney | H01L 23/473 |
| 2019/0393128 | A1* | 12/2019 | Yoshida | H01L 23/473 |
| 2020/0111725 | A1* | 4/2020 | Tomita | F28F 9/0221 |
| 2020/0170147 | A1* | 5/2020 | Arai | H01L 23/473 |
| 2020/0273778 | A1* | 8/2020 | Hoegerl | H01L 23/3735 |
| 2020/0286811 | A1* | 9/2020 | Komo | H05K 7/20927 |
| 2020/0321266 | A1* | 10/2020 | Kato | H01L 23/3672 |
| 2020/0321884 | A1* | 10/2020 | Deguchi | H05K 7/20927 |
| 2020/0375069 | A1* | 11/2020 | Zhang | H01L 23/4093 |
| 2020/0390000 | A1* | 12/2020 | Sasaki | H05K 7/209 |
| 2021/0044213 | A1* | 2/2021 | Kojima | H01G 2/106 |
| 2021/0092882 | A1* | 3/2021 | Ruppert | H01L 23/4334 |
| 2021/0130672 | A1* | 5/2021 | Kodama | H05K 7/20254 |
| 2021/0219465 | A1* | 7/2021 | Wang | H05K 7/20863 |
| 2021/0243923 | A1* | 8/2021 | Hwang | H05K 7/2029 |
| 2021/0274690 | A1* | 9/2021 | Cho | H05K 7/20927 |
| 2021/0280498 | A1* | 9/2021 | Kang | H01L 23/3675 |
| 2022/0046830 | A1* | 2/2022 | Gradinger | H01L 25/50 |

* cited by examiner

COOLING SYSTEM FOR POWER CONVERSION DEVICE

CROSS REFERENCE TO RELATED APPLICATION

The present application claims priority to Korean Patent Application No. 10-2019-0048091 filed on Apr. 24, 2019, the entire contents of which is incorporated herein for all purposes by this reference.

BACKGROUND OF THE INVENTION

Field of the Invention

The present invention relates to a cooling system for a power conversion device.

Description of Related Art

The power conversion device of an eco-friendly vehicle receives a DC current from a high-voltage battery, converts the DC current into an AC current, supplies the AC current to a motor, and controls the torque and revolutions per minute of the motor by adjusting the intensity and phase of the AC current. A power module of a power conversion device is a switching device that converts a DC current input from a high-voltage battery in an AC current, and is damaged when heat is generated in a switching process and temperature increases over a predetermined level. Accordingly, it is required to cool the power model of all power conversion devices. Furthermore, as the cooling performance is improved, the power module can convert a current with high quality, so that the performance of the power conversion devices is also improved. In the power conversion devices of the related art, a cooling channel is formed in a housing or a power module is combined with a separate cooler, cooling the power module.

Figure 1:
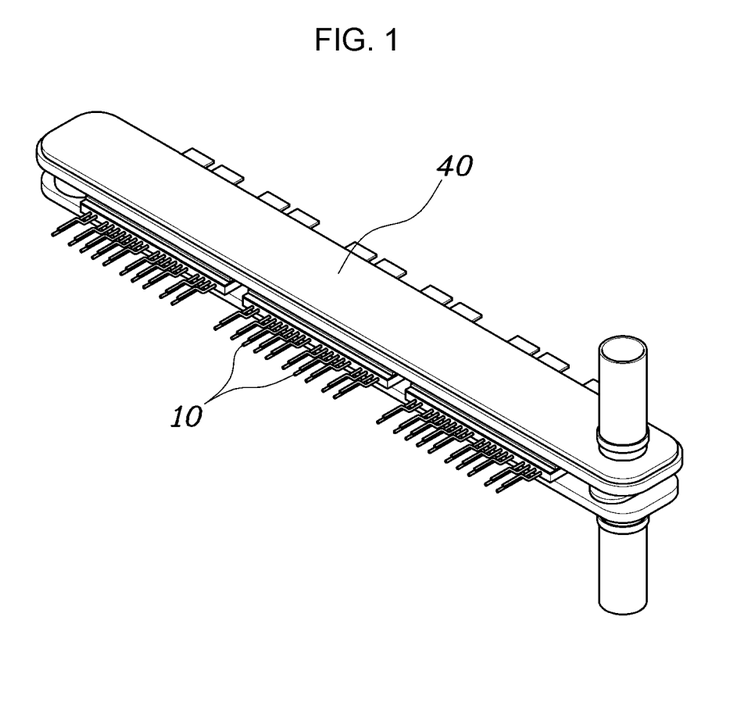
FIG. 1 is a view showing a cooler for cooling a power module in the related art.
Figure 2:
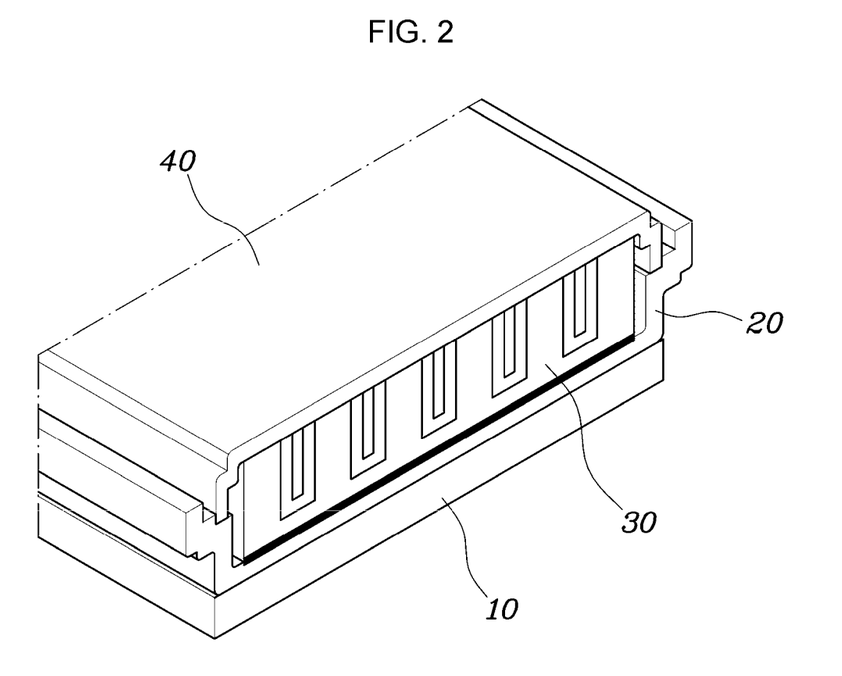
FIG. 2 is a cross-sectional view showing the inside of the cooler in the related art.

FIG. 1 is a view showing a cooler for cooling a power module in the related art and FIG. 2 is a cross-sectional view showing the inside of the cooler in the related art. Referring to FIG. 1 and FIG. 2, a cooler 1 for cooling a power module in the related art has a structure in which a first plate 20 is mounted over a power module 10, a fin plate 30 having cooling fans is mounted on the top portion of the first plate 20, the top portion of the first plate 20 and the bottom portion of the fin plate 30 are coupled by welding, and a second plate 40 having a cooling tube through which cooling water flows is mounted over the fin plate 30.

According to the present structure of a cooler, three thermal conductive layers of the layer of the first plate 20, the welding layer formed by welding the first plate 20 and the fin plate 30, and the layer of the fin plate 30 are formed. In other words, there is larger heat resistance that interferes with heat transfer from the second plate 40, in which cooling water flows, to the power module, so there is a limit in cooling performance. Accordingly, it is required to develop a technology that improves the cooling performance of a cooler by reducing heat resistance by minimizing thermal conductive layers.

The information disclosed in this Background of the Invention section is only for enhancement of understanding of the general background of the invention and may not be taken as an acknowledgement or any form of suggestion that this information forms the prior art already known to a person skilled in the art.

BRIEF SUMMARY

Various aspects of the present invention are directed to providing a cooling system for a power conversion device, the cooling system being able to minimize heat resistance between the upper portion of a cooling tube and a power conversion module by minimizing thermal conductive layers between the upper portion of the cooling tube and the power conversion module, thus, being able to improve cooling performance.

In view of an aspect, a cooling system for a power conversion device according to an exemplary embodiment of the present invention includes: a cooler upper-part having a plurality of cooling tubes through which cooling water flows and a connecting portion connecting the cooling tubes; one or more power conversion modules mounted between the cooling tubes; a cooling fin plate formed in a plate shape with cooling fins on a side and mounted on a side of the power conversion module such that the cooling fins are mounted in the opposite directions with respect to the power conversion module; and a cooler lower-part mounted between the cooling fin plate and the cooler upper-part, having one or more open holes formed at a portion, and combined with the cooling fin plate by inserting the cooling fins of the cooling fin plate in the open holes.

The cooler upper-part may further have a cooling water inlet port through which cooling water flows inside and a cooling water outlet port through which cooling water is discharged.

The cooling tubes may be made of aluminum and the cooling fin plate may be made of copper.

The material of the cooling fin plate may have higher thermal conductivity than the material of the cooling tubes.

The cooling plate may have a coupling portion having a predetermined area between the cooling fins and edge portions of the cooling plate, and the cooler lower-part and the cooling fin plate may be combined by inserting the cooling fins in the open holes of the cooler lower-part and welding the coupling portion to contact portions on a bottom portion of the cooler lower-part.

A material or an object that has high thermal conductivity and is different from the material of the cooling tube may be inserted between the cooler upper-part and the cooling fins of the cooling fin plate.

Protrusive guides may be formed on both sides of a surface without the cooling fans in the cooling fin plate.

The cooling fin plate may be made of copper.

The open holes may be formed at positions corresponding to the cooling fins when the cooling fin plate is combined.

A through-connection hole may be formed at a position, which corresponds to the connecting portion of the cooler upper-part, at the cooler lower-part, and cooling water in the cooling tubes may flow through the connection hole.

A width of the cooler lower-part may be greater than a width of the cooler upper-part, and edge portions of the cooler lower-part may have a predetermined height.

According to an exemplary embodiment of the present invention, the cooling fin plates are mounted on both sides of the power conversion module, the cooling fins of the cooling fin plates are inserted into the open holes formed at the cooler lower-part, and the cooler lower-part and the cooling fin plate are combined by welding only a portion on the bottom portion of the cooler lower-part that are in contact with the coupling portion of the cooling fin plate, minimizing thermal conductive layers between the cooler upper-part and the power conversion module. Accordingly, it is possible to minimize heat resistance between the cooler upper-part and the power conversion module, and accordingly, it is possible to improve cooling performance.

The methods and apparatuses of the present invention have other features and advantages which will be apparent from or are set forth in more detail in the accompanying drawings, which are incorporated herein, and the following Detailed Description, which together serve to explain certain principles of the present invention.

It may be understood that the appended drawings are not necessarily to scale, presenting a somewhat simplified representation of various features illustrative of the basic principles of the present invention. The specific design features of the present invention as included herein, including, for example, specific dimensions, orientations, locations, and shapes will be determined in part by the particularly intended application and use environment.

In the figures, reference numbers refer to the same or equivalent portions of the present invention throughout the several figures of the drawing.

DETAILED DESCRIPTION

Reference will now be made in detail to various embodiments of the present invention(s), examples of which are illustrated in the accompanying drawings and described below. While the present invention(s) will be described in conjunction with exemplary embodiments of the present invention, it will be understood that the present description is not intended to limit the present invention(s) to those exemplary embodiments. On the other hand, the present invention(s) is/are intended to cover not only the exemplary embodiments of the present invention, but also various alternatives, modifications, equivalents and other embodiments, which may be included within the spirit and scope of the present invention as defined by the appended claims.

A cooling system for a power conversion device according to various embodiments of the present invention is described hereafter in detail with reference to the accompanying drawings.

Figure 3:
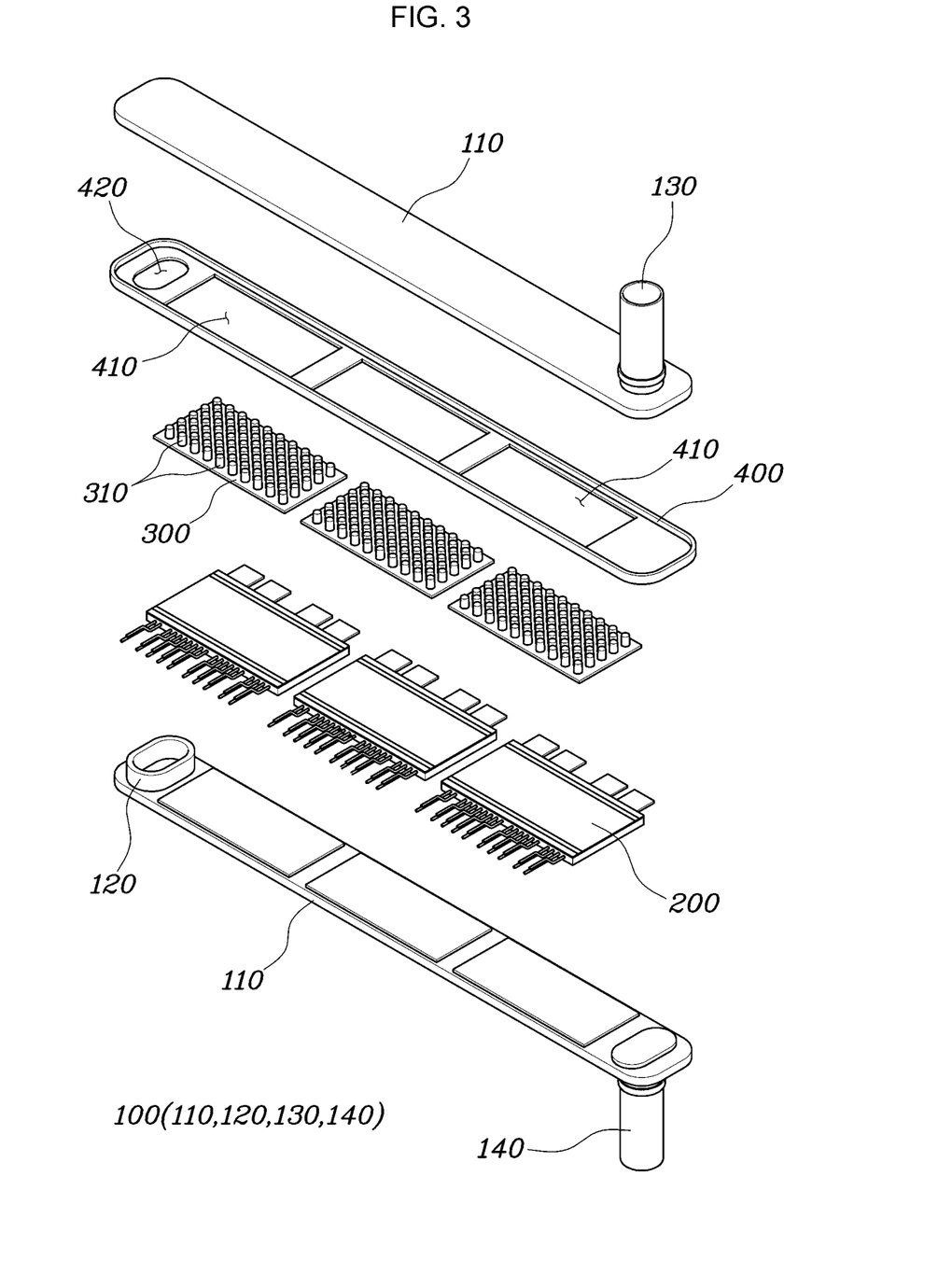
FIG. 3 is a view showing the entire configuration of a cooling system for a power conversion device according to an exemplary embodiment of the present invention.
Figure 4:
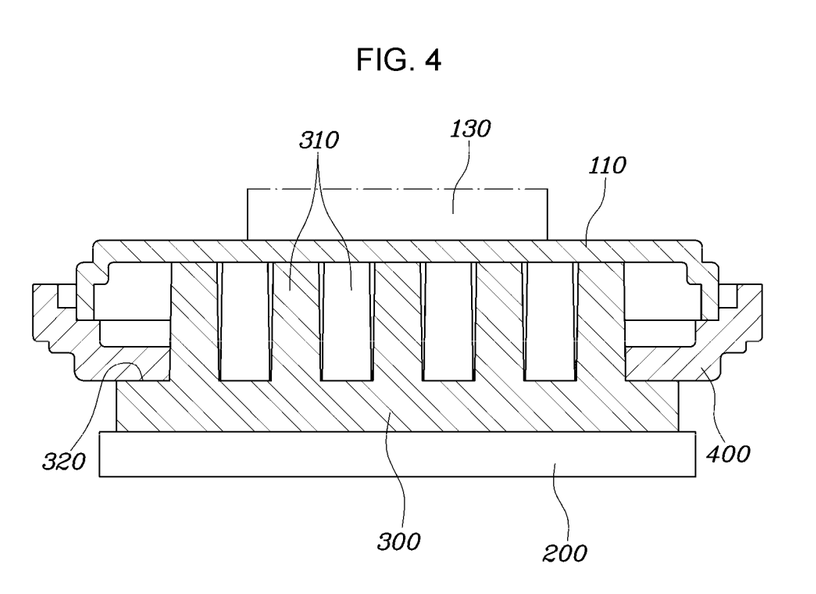
FIG. 4 is a cross-sectional view showing the inside of the cooling system for a power conversion device according to an exemplary embodiment of the present invention.
Figure 5:
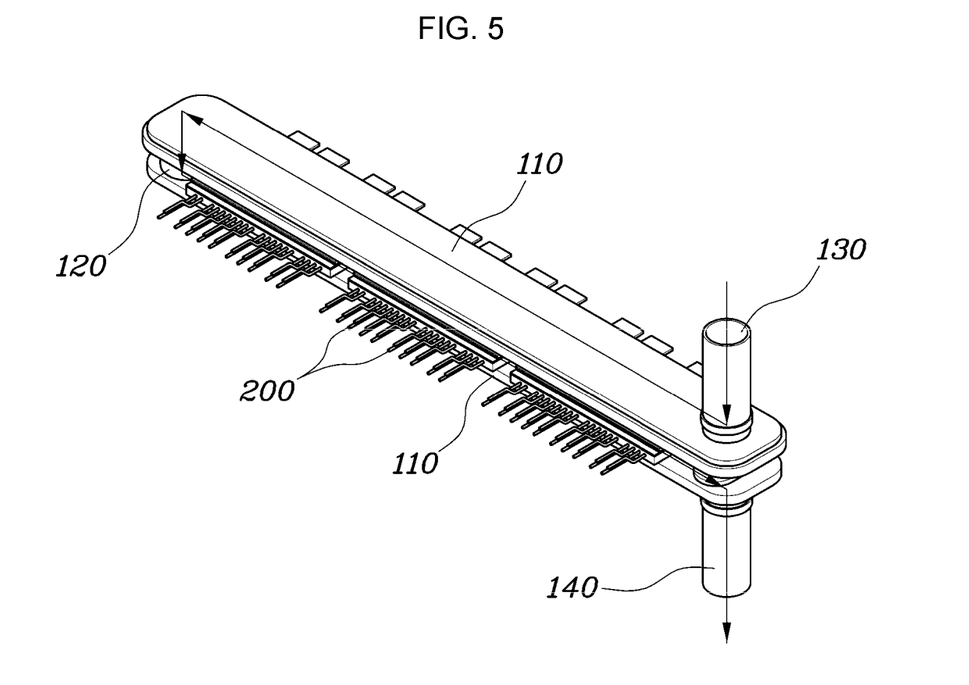
FIG. 5 is a view showing cooling water cooling a power conversion module by flowing into the upper portion of a cooling tube and flowing out of the cooling tube in the cooling system for a power conversion device according to an exemplary embodiment of the present invention.
Figure 6:
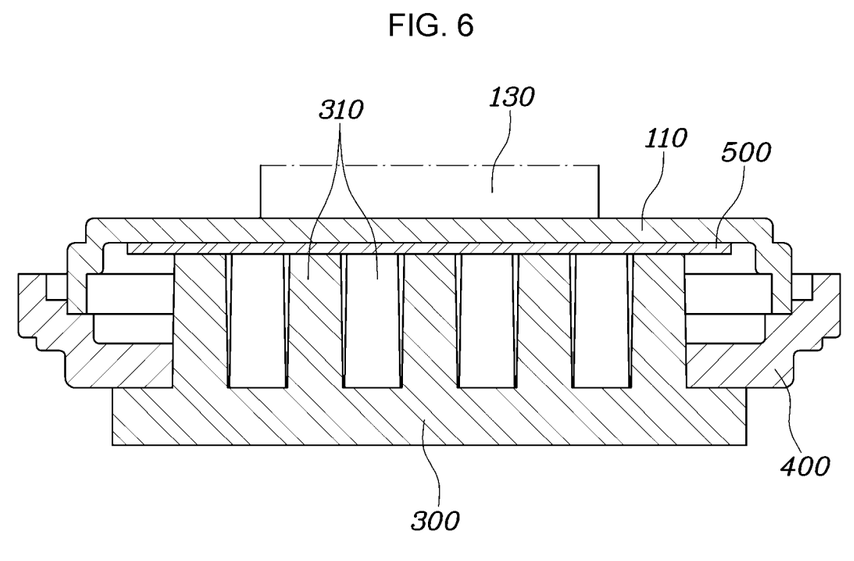
FIG. 6 is a view when an object having high thermal conductivity is mounted between the cooling tube and cooling fins of a cooling fin plate in the cooling system for a power conversion device according to an exemplary embodiment of the present invention.
Figure 7:
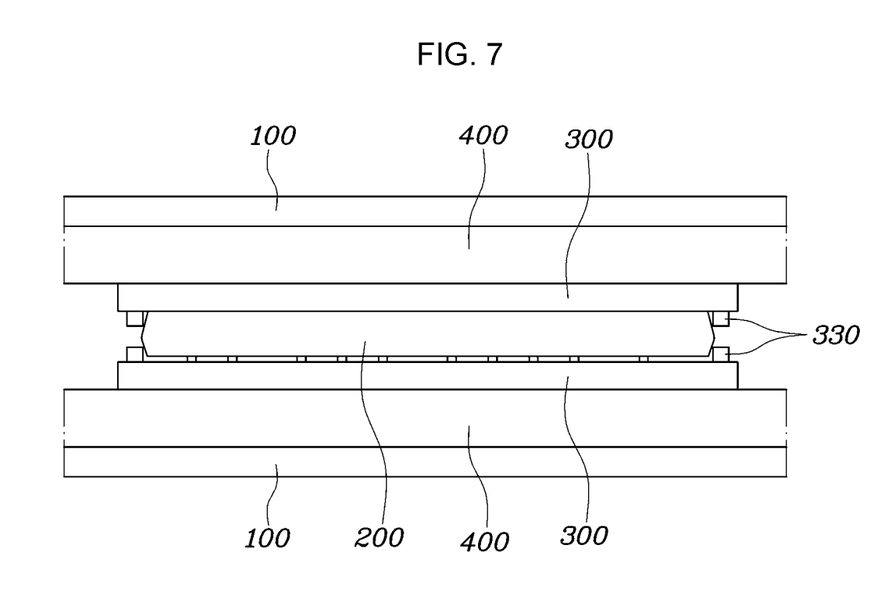
FIG. 7 is a view showing guides protruding from both end portions of a surface without a cooling fin in the cooling fin plate in the cooling system for a power conversion device according to an exemplary embodiment of the present invention.
Figure 8:
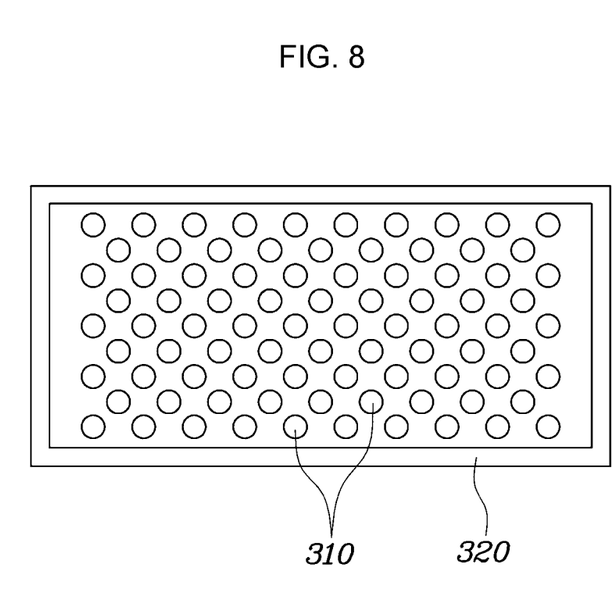
FIG. 8 is a view showing a coupling portion formed at the cooling fin plate of the cooling system for a power conversion device according to an exemplary embodiment of the present invention.

FIG. 3 is a view showing the entire configuration of a cooling system for a power conversion device according to an exemplary embodiment of the present invention, FIG. 4 is a cross-sectional view showing the inside of the cooling system for a power conversion device according to an exemplary embodiment of the present invention, FIG. 5 is a view showing cooling water cooling a power conversion module by flowing into the upper portion of a cooling tube and flowing out of the cooling tube, FIG. 6 is a view when an object having high thermal conductivity is mounted between the cooling tube and cooling fins of a cooling fin plate, FIG. 7 is a view showing guides protruding from both end portions of a surface without a cooling fin in the cooling fin plate, and FIG. 8 is a view showing a coupling portion formed at the cooling fin plate.

As shown in FIG. 3 and FIG. 4, a cooling system for a power conversion device according to an exemplary embodiment of the present invention may include a cooler upper-part 100, a power conversion module 200, a cooling fin plate 300, and a cooler lower-part 400. The detailed configuration of the power conversion device according to an exemplary embodiment of the present invention is described in more detail hereafter.

The cooler upper-part 100 may have a plurality of cooling tubes 110 through which cooling water flows and a connecting portion 120 connecting the cooling tubes 110. The cooling tubes 110 may be made of aluminum.

The cooler upper-part 100 may further have a cooling water inlet port 130 through which cooling water flows inside and a cooling water outlet port 140 through which cooling water is discharged. Though not shown in detail in the drawings, the cooling water inlet port 130 and the cooling water outlet port 140 of the cooler upper-part 100 are connected to a channel formed in a housing with which the cooling system for a power conversion device according to an exemplary embodiment of the present invention is combined, whereby cooling water can flow inside and outside. The housing may have an inlet and outlet through which cooling water flows inside and outside.

Meanwhile, as shown in FIG. 3, the cooler upper-part 100 may be mounted at both sides with the power conversion module 200 therebetween. As described above, according to the cooling system for a power conversion device according to an exemplary embodiment of the present invention, as shown in FIG. 5, cooling water flowing inside through the cooling water inlet port 130 cools both sides of the power conversion module 200 while flowing to the cooling water outlet port 140 through the cooling tube 110 and the connecting portion 120. Accordingly, cooling performance may be improved and accordingly, the performance of the entire power conversion device may be improved.

The power conversion module 200 includes a plurality of switching devices and one or more power conversion modules 200 may be mounted between the cooling tubes 110. Furthermore, the power conversion module 200 may be supplied with a DC current from a capacitor that receives a DC current from a high-voltage battery mounted in a vehicle. Furthermore, the power conversion module 200 can convert the DC current supplied from the capacitor into an AC current by switching the switching devices. Depending on embodiments, the power conversion module 200 may be an Insulated Gate Bipolar Transistor (IGBT) etc. However, this is only an exemplary embodiment and various semiconductor devices may be used as the power conversion module of the present invention.

The cooling fin plate 300 may formed in a plate shape with cooling fins 310 on a side thereof. Furthermore, the cooling fin plate 300, as shown in FIG. 3, may be mounted on a side of the power conversion module 200 such that the cooling fins 310 are mounted in the opposite directions with respect to the power conversion module 200.

In more detail, according to an exemplary embodiment of the present invention, the cooling fins 310 of the cooling fin plate 300 are inserted into open holes 410 of the cooler lower-part 400, which is described below, in contact with the cooling tubes 110 through which cooling water flows, and the opposite side without the cooling fins 310 of the cooling plate 300 is in contact with both sides of the power conversion module 200. Accordingly, cooling water can cool the power conversion module 200 by absorbing heat generated from the power conversion module 200 while flowing through the cooling tubes 110 and the connection hole 420.

Furthermore, as shown in FIG. 8, the cooling fin plate 300 may have a coupling portion 320 having a predetermined area between the cooling fins 310 and edge portions. The coupling portion 320 can couple the cooling fin plate 300 to the cooler lower-part 400 by inserting the cooling fins 310 in the open holes 410 of the cooler lower-part 400 and welding the coupling portion 320 to the contact portions on the bottom portion of the cooler lower-part 400.

Furthermore, depending on embodiments, as shown in FIG. 6, a material or an object 500 that has high thermal conductivity and is different from the material of the cooling tube 110 may be inserted between the cooling fins 310 of the cooling fin plate 300 and the cooler upper-part 100. The object having high thermal conductivity may be made of a material having elasticity, and depending on embodiments, it may be a pad having elasticity and high thermal conductivity. As described above, since a material or an object having high thermal conductivity is inserted between the cooling fins 310 and the cooling tube 110 in an exemplary embodiment of the present invention, thermal conductivity may be improved, and thus, the entire cooling performance may be improved.

Furthermore, protrusive guides 330 may be formed on both end portions of the surface having no cooling fans 310 in the cooling fin plate 300, as shown in FIG. 7. The power conversion module 200 is mounted between the cooling fin plates 300, but it was slightly difficult to dispose the power conversion module 200 at a predetermined position between the cooling fin plates 300 in the manufacturing process. To solve the present problem, in an exemplary embodiment of the present invention, as shown in FIG. 7, since the protrusive guides 330 are formed on both end portions of the cooling fin plate 300 being in contact with the power conversion module 200, it is possible to more easily dispose the power conversion module 200 at a predetermined position in the manufacturing process.

Meanwhile, the cooling fin plate 300 may be made of copper having high thermal conductivity in an exemplary embodiment of the present invention. Furthermore, the material of the cooling fin plate 300 may be a material having higher thermal conductivity than the material of the cooling tubes 110.

The cooler lower-part 400 may be mounted between the cooling fin plate 300 and the cooler upper-part 100. Furthermore, as shown in FIG. 3, one or more open holes 410 may be formed at portions of the cooler lower-part 400 and the cooling fins 310 of the cooling fin plate 300 may be inserted into the open holes 410. The open holes 410 may be formed at positions corresponding to the cooling fins 310 when the cooling fin plate 300 is combined. Furthermore, the number of the open holes 410 formed at the cooler lower-part 400 may correspond to the number of the cooling fin plate 300. Furthermore, the cooling fin plate 300 and the cooler lower-part 400 may be combined by welding the surface being in contact with the coupling portion 320 of the cooler lower-part 400 after the cooling fins 310 are inserted into the open holes 410.

Furthermore, a vertical through-connection hole 420 may be formed at the position, which corresponds to the connecting portion 120 of the cooler upper-part 100, at the cooler lower-part 400. Accordingly, as shown in FIG. 5, cooling water flowing into the cooling water inlet port 130 through the connection hole 420 can flow to the cooling water outlet port 140 through the cooling tubes 110.

The width of the cooler lower-part 400 may be greater than the width of the cooler upper-part 100. Furthermore, the edge portions of the cooler lower-part 400 may have a predetermined height. As describe above, since the width of the cooler lower-part 400 is greater than the width of the cooler upper-part 100 and the edge portions of the cooler lower-part 400 have a predetermined height, the cooler upper-part 100 may be stably accommodated inside the cooler lower-part 400.

In the cooling system having the above-mentioned configuration characteristics for a power conversion device according to an exemplary embodiment of the present invention, the cooling fin plates are mounted on both sides of the power conversion module, the cooling fins of the cooling fin plates are inserted into the open holes formed at the cooler lower-part, and the cooler lower-part and the cooling fin plate are combined by welding only portions on the bottom portion of the cooler lower-part that are contact with the coupling portion of the cooling fin plate, minimizing thermal conductive layers between the cooler upper-part and the power conversion module. Accordingly, it is possible to minimize heat resistance between the cooler upper-part and the power conversion module, and accordingly, it is possible to improve cooling performance.

For convenience in explanation and accurate definition in the appended claims, the terms "upper", "lower", "inner", "outer", "up", "down", "upwards", "downwards", "front", "rear", "back", "inside", "outside", "inwardly", "outwardly", "internal", "external", "inner", "outer", "forwards", and "backwards" are used to describe features of the exemplary embodiments with reference to the positions of such features as displayed in the figures. It will be further understood that the term "connect" or its derivatives refer both to direct and indirect connection.

The foregoing descriptions of specific exemplary embodiments of the present invention have been presented for purposes of illustration and description. They are not intended to be exhaustive or to limit the present invention to the precise forms disclosed, and obviously many modifications and variations are possible in light of the above teachings. The exemplary embodiments were chosen and described to explain certain principles of the present invention and their practical application, to enable others skilled in the art to make and utilize various exemplary embodiments of the present invention, as well as various alternatives and modifications thereof. It is intended that the scope of the present invention be defined by the Claims appended hereto and their equivalents.

What is claimed is:

1. A cooling system for a power conversion device, the cooling system comprising:
    a first cooler part having a plurality of cooling tubes through which cooling water flows and a connecting portion connecting the plurality of cooling tubes;
    at least one power conversion module mounted between the plurality of cooling tubes;
    a cooling fin plate including cooling fins on a side of the cooling fin plate and mounted on a side of the at least one power conversion module wherein the cooling fins are mounted in an opposite direction with respect to the at least one power conversion module; and
    a second cooler part mounted between the cooling fin plate and the first cooler part, having at least one open hole formed at a portion, and combined with the cooling fin plate by inserting the cooling fins of the cooling fin plate in the at least one open hole,
    wherein the cooling fin plate is mounted between the at least one power conversion module and the second cooler part.

2. The cooling system of claim 1,
    wherein the first cooler part further has a cooling water inlet port through which the cooling water flows inside the first cooler part and a cooling water outlet port through which the cooling water is discharged from the first cooler part.

3. The cooling system of claim 1,
    wherein the plurality of cooling tubes is made of aluminum and the cooling fin plate is made of copper.

4. The cooling system of claim 1,
    wherein a material of the cooling fin plate has higher thermal conductivity than a material of the plurality of cooling tubes.

5. The cooling system of claim 1,
    wherein the cooling fin plate has a coupling portion having a predetermined area between the cooling fins and edge portions of the cooling fin plate, and
    wherein the second cooler part and the cooling fin plate are combined by inserting the cooling fins in the at least one open hole of the second cooler part and welding the coupling portion to contact the predetermined are on a bottom portion of the second cooler part.

6. The cooling system of claim 1,
    wherein a material or an object that has high thermal conductivity and is different from a material of the plurality of cooling tubes is inserted between the first cooler part and the cooling fins of the cooling fin plate.

7. The cooling system of claim 1,
    wherein protrusive guides are formed on a first end portion and a second end portion of a surface lacking of the cooling fins in the cooling fin plate to dispose the at least one power conversion module between the protrusive guides.

8. The cooling system of claim 1,
    wherein the at least one open hole is formed at a position of the second cooler part corresponding to the cooling fins when the cooling fin plate is combined.

9. The cooling system of claim 1,
    wherein a connection hole is formed at a position corresponding to the connecting portion of the first cooler part, at the second cooler part, and the cooling water in the plurality of cooling tubes flows through the connection hole.

10. The cooling system of claim 1,
    wherein a width of the second cooler part is greater than a width of the first cooler part, and edge portions of the second cooler part have a predetermined height.

* * * * *